(12) United States Patent
Sorensen et al.

(10) Patent No.: US 9,807,503 B1
(45) Date of Patent: Oct. 31, 2017

(54) SYSTEMS AND METHODS FOR USE OF ADAPTIVE SECONDARY PATH ESTIMATE TO CONTROL EQUALIZATION IN AN AUDIO DEVICE

(71) Applicant: Cirrus Logic, Inc., Austin, TX (US)

(72) Inventors: Bryant E. Sorensen, Austin, TX (US); Jon D. Hendrix, Wimberley, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/272,169

(22) Filed: Sep. 21, 2016

Related U.S. Application Data

(63) Continuation of application No. 14/476,471, filed on Sep. 3, 2014, now Pat. No. 9,478,212.

(51) Int. Cl.
*H03G 5/00* (2006.01)
*G10K 11/16* (2006.01)
(Continued)

(52) U.S. Cl.
CPC .............. *H04R 3/04* (2013.01); *G10K 11/178* (2013.01); *G10K 11/1784* (2013.01);
(Continued)

(58) Field of Classification Search
CPC .............. G10K 11/178; G10K 11/1784; G10K 11/1788; G10K 2210/3014;
(Continued)

(56) References Cited

U.S. PATENT DOCUMENTS 4,649,507 A 3/1987 Inaba et al.
5,117,401 A 5/1992 Feintuch
(Continued)

FOREIGN PATENT DOCUMENTS

CN 101552939 A 10/2009
EP 0756407 A2 1/1997
(Continued)

OTHER PUBLICATIONS

Combined Search and Examination Report under Sections 17 and 18(3), United Kingdom Application No. GB1611064.5, dated Dec. 28, 2016.
(Continued)

*Primary Examiner* — Andrew L Sniezek
(74) *Attorney, Agent, or Firm* — Jackson Walker L.L.P.

(57) ABSTRACT

In accordance with embodiments of the present disclosure, an adjustable equalization filter may have a response that generates an equalized source audio signal from a source audio signal to account for effects of changes in an electro-acoustical path of the source audio signal to a transducer. An equalizer coefficient control block may adapt the response of the adjustable equalization filter in response to changes in a response of a secondary path estimate filter for modeling the electro-acoustical path of a source audio signal through the transducer, wherein a response of the secondary path estimate filter is adapted in conformity with an error microphone signal indicative of the acoustic output of the transducer.

51 Claims, 4 Drawing Sheets

(51) Int. Cl.
*H04R 3/04* (2006.01)
*G10K 11/178* (2006.01)
*H04R 1/10* (2006.01)
*H04R 5/033* (2006.01)
*H03G 5/16* (2006.01)
*H04R 3/00* (2006.01)

(52) U.S. Cl.
CPC ......... *G10K 11/1788* (2013.01); *H03G 5/165* (2013.01); *H04R 1/1083* (2013.01); *H04R 5/033* (2013.01); *G10K 2210/3014* (2013.01); *G10K 2210/3022* (2013.01); *G10K 2210/3045* (2013.01); *H04R 3/005* (2013.01); *H04R 2410/05* (2013.01)

(58) Field of Classification Search
CPC ... G10K 2210/3045; G10K 2210/3022; H03G 5/165; H04R 5/033; H04R 3/005; H04R 1/1083; H04R 2410/05; H04R 3/04
See application file for complete search history.

(56) References Cited

U.S. PATENT DOCUMENTS

| | | | |
|---|---|---|---|
| 5,204,827 A | 4/1993 | Fujita et al. | |
| 5,272,656 A | 12/1993 | Genereux | |
| 5,377,276 A | 12/1994 | Terai et al. | |
| 5,563,819 A | 10/1996 | Nelson | |
| 5,633,795 A | 5/1997 | Popovich | |
| 5,809,152 A | 9/1998 | Nakamura et al. | |
| 6,185,300 B1 | 2/2001 | Romesburg | |
| 6,317,501 B1 | 11/2001 | Matsuo | |
| 7,110,864 B2 | 9/2006 | Restrepo et al. | |
| 7,368,918 B2 | 5/2008 | Henson et al. | |
| 7,406,179 B2 | 7/2008 | Ryan | |
| 7,441,173 B2 | 10/2008 | Restrepo et al. | |
| 7,555,081 B2 | 6/2009 | Keele, Jr. | |
| 8,144,888 B2 | 3/2012 | Berkhoff et al. | |
| 8,155,334 B2 | 4/2012 | Joho et al. | |
| 8,254,589 B2 | 8/2012 | Mitsuhata | |
| 8,311,243 B2 | 11/2012 | Tucker et al. | |
| 8,374,358 B2 | 2/2013 | Buck et al. | |
| 8,401,204 B2 | 3/2013 | Odent et al. | |
| 8,411,872 B2 | 4/2013 | Stothers et al. | |
| 8,526,628 B1 | 9/2013 | Massie et al. | |
| 8,532,310 B2 | 9/2013 | Gauger, Jr. et al. | |
| 8,539,012 B2 | 9/2013 | Clark | |
| 8,909,524 B2 | 12/2014 | Stoltz et al. | |
| 8,942,976 B2 | 1/2015 | Li et al. | |
| 8,948,410 B2 | 2/2015 | Van Leest | |
| 8,977,545 B2 | 3/2015 | Zeng et al. | |
| 9,020,160 B2 | 4/2015 | Gauger, Jr. | |
| 9,082,391 B2 | 7/2015 | Yermeche et al. | |
| 9,203,366 B2 | 12/2015 | Eastty | |
| 9,392,364 B1 | 7/2016 | Milani et al. | |
| 9,478,212 B1* | 10/2016 | Sorensen | H03G 5/165 |
| 2004/0001450 A1 | 1/2004 | He et al. | |
| 2004/0017921 A1 | 1/2004 | Mantovani | |
| 2004/0122879 A1 | 6/2004 | McGrath | |
| 2005/0110568 A1 | 5/2005 | Robinson et al. | |
| 2005/0175187 A1 | 8/2005 | Wright et al. | |
| 2006/0013408 A1 | 1/2006 | Lee | |
| 2006/0018460 A1 | 1/2006 | McCree | |
| 2007/0208520 A1 | 9/2007 | Zhang et al. | |
| 2009/0080670 A1 | 3/2009 | Solbeck et al. | |
| 2009/0175461 A1 | 7/2009 | Nakamura et al. | |
| 2010/0226210 A1 | 9/2010 | Kordis et al. | |
| 2010/0316225 A1 | 12/2010 | Saito | |
| 2010/0322430 A1 | 12/2010 | Isberg | |
| 2011/0091047 A1 | 4/2011 | Konchitsky et al. | |
| 2011/0099010 A1 | 4/2011 | Zhang | |
| 2012/0179458 A1 | 7/2012 | Oh et al. | |
| 2012/0185524 A1 | 7/2012 | Clark | |
| 2013/0022213 A1 | 1/2013 | Alcock | |
| 2013/0182792 A1 | 7/2013 | Wyville | |
| 2014/0307887 A1 | 10/2014 | Alderson | |
| 2014/0341388 A1* | 11/2014 | Goldstein | H04R 1/1083 381/71.11 |
| 2015/0195646 A1 | 7/2015 | Kumar et al. | |
| 2016/0180830 A1 | 6/2016 | Lu et al. | |

FOREIGN PATENT DOCUMENTS

| | | |
|---|---|---|
| EP | 0898266 A2 | 2/1999 |
| EP | 1921603 A2 | 5/2008 |
| EP | 2259250 A1 | 12/2010 |
| GB | 2539280 A | 12/2016 |
| JP | 06006246 | 1/1994 |
| JP | H05232755 | 8/1994 |
| JP | 07098592 | 4/1995 |
| JP | H11305783 A | 11/1999 |
| JP | 2000089770 | 3/2000 |
| JP | 2002010355 | 1/2002 |
| JP | 2004007107 | 1/2004 |
| JP | 2007060644 | 3/2007 |
| JP | 2008015046 A | 1/2008 |
| JP | 2010277025 | 12/2010 |
| JP | 2011061449 | 3/2011 |
| WO | 93/04529 A1 | 3/1993 |
| WO | 94/07212 A1 | 3/1994 |
| WO | 2006125061 A1 | 11/2006 |
| WO | 2009041012 A1 | 4/2009 |
| WO | 2009110087 A1 | 9/2009 |
| WO | 2009155696 A1 | 12/2009 |
| WO | 2013106370 A1 | 7/2013 |
| WO | 2016054186 A1 | 4/2016 |
| WO | 2016100602 A1 | 6/2016 |
| WO | 2016198481 A2 | 12/2016 |

OTHER PUBLICATIONS

Combined Search and Examination Report under Sections 17 and 18(3), United Kingdom Application No. 3B1611080.1, dated Dec. 28, 2016.

International Search Report and Written Opinion of the International Searching Authority, International Application No. PCT/US2016/047828, dated Dec. 1, 2016.

International Search Report and Written Opinion of the International Searching Authority, International Application No. PCT/US2016/039523, dated Dec. 7, 2016.

Wu, Lifu et al., "Decoupling feedforward and feedback structures in hybrid active noise control systems for uncorrelated narrowband disturbances", Journal of Sound and Vibration, vol. 350, Aug. 18, 2015, pp. 1-10, Section 2, figures 1-3.

Lopez-Caudana, Edgar et al., "A Hybrid Noise Cancelling Algorithm with Secondary Path Estimation", WSEAS Transactions on Signal Processing, vol. 4, No. 12, Dec. 1, 2008, pp. 677=687, Sections 2 and 3, figures 4-8.

International Search Report and Written Opinion of the International Searching Authority, International Application No. PCT/EP2016/063079, dated Dec. 12, 2016.

Goeckler, H.G. et al.: Efficient Multirate Digital Filters Based on Fractional Polyphase Decomposition for Subnyquist Processing, Proceedings of the European Conference on Circuit Theory and Design, vol. 1, Jan. 1, 1999, pp. 409-412.

Examination Report under Section 18(3), United Kingdom Application No. GB1512832.5, dated Feb. 2, 2017.

\* cited by examiner

SYSTEMS AND METHODS FOR USE OF ADAPTIVE SECONDARY PATH ESTIMATE TO CONTROL EQUALIZATION IN AN AUDIO DEVICE

This application is a continuation of U.S. Non-Provisional application Ser. No. 14/476,471 filed on Sep. 3, 2014, which is incorporated by reference herein in its entirety.

FIELD OF DISCLOSURE

The present disclosure relates in general to providing for adaptive playback equalization in an audio device.

BACKGROUND

Personal audio devices, such as mobile/cellular telephones, cordless telephones, and other consumer audio devices, such as mp3 players, are in widespread use. Performance of such devices with respect to intelligibility can be improved by providing noise canceling using a microphone to measure ambient acoustic events and then using signal processing to insert an anti-noise signal into the output of the device to cancel the ambient acoustic events. Because the acoustic environment around personal audio devices such as wireless telephones can change dramatically, depending on the sources of noise that are present and the position of the device itself, it is desirable to adapt the noise canceling to take into account such environmental changes.

Some personal audio devices also include equalizers. Equalizers typically attempt to apply to a source audio signal an inverse of a response of the electro-acoustical path of the source audio signal through the transducer, in order to reduce the effects of the electro-acoustical path. In most traditional approaches, equalization is performed with a static equalizer. However, an adaptive equalizer may provide better output sound quality than a static equalizer, and thus, may be desirable in many applications.

SUMMARY

In accordance with the teachings of the present disclosure, the disadvantages and problems associated with improving audio performance of a personal audio device may be reduced or eliminated.

In accordance with embodiments of the present disclosure, a personal audio device may include a personal audio device housing, a transducer, an error microphone, and a processing circuit. The transducer may be coupled to the housing and may be configured to reproduce an output audio signal including an equalized source audio signal for playback to a listener. The error microphone may be coupled to the housing in proximity to the transducer and may be configured to provide an error microphone signal indicative of the acoustic output of the transducer. The processing circuit may implement a secondary path estimate filter for modeling an electro-acoustical path of a source audio signal through the transducer, a secondary path estimate filter coefficient control block that shapes a response of the secondary path estimate filter in conformity with the error microphone signal, an adjustable equalization filter having a response that generates the equalized source audio signal from the source audio signal to account for effects of changes in an electro-acoustical path of the source audio signal, and an equalizer coefficient control block that adapts the response of the adjustable equalization filter in response to changes in the response of the secondary path estimate filter.

In accordance with these and other embodiments of the present disclosure, a method may include receiving an error microphone signal indicative of an acoustic output of a transducer. The method may also include modeling an electro-acoustical path of a source audio signal with a secondary path estimate filter. The method may further include adapting the response of the secondary path estimate filter in conformity with the error microphone signal. The method may additionally include generating an equalized source audio signal from a source audio signal by filtering the source audio signal with an adjustable equalization filter to account for effects of changes in an electro-acoustical path of the source audio signal. The method may also include adapting the response of the adjustable equalization filter in response to changes in the response of the secondary path estimate filter.

In accordance with these and other embodiments of the present disclosure, an integrated circuit may comprise an output, an error microphone input, and a processing circuit. The output may be configured to provide a signal to a transducer including an equalized source audio signal for playback. The error microphone input may be configured to receive an error microphone signal indicative of the acoustic output of the transducer. The processing circuit may implement a secondary path estimate filter for modeling an electro-acoustical path of a source audio signal through the transducer, a secondary path estimate filter coefficient control block that shapes a response of the secondary path estimate filter in conformity with the error microphone signal, an adjustable equalization filter having a response that generates the equalized source audio signal from the source audio signal to account for effects of changes in an electro-acoustical path of the source audio signal, and an equalizer coefficient control block that adapts the response of the adjustable equalization filter in response to changes in the response of the secondary path estimate filter.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
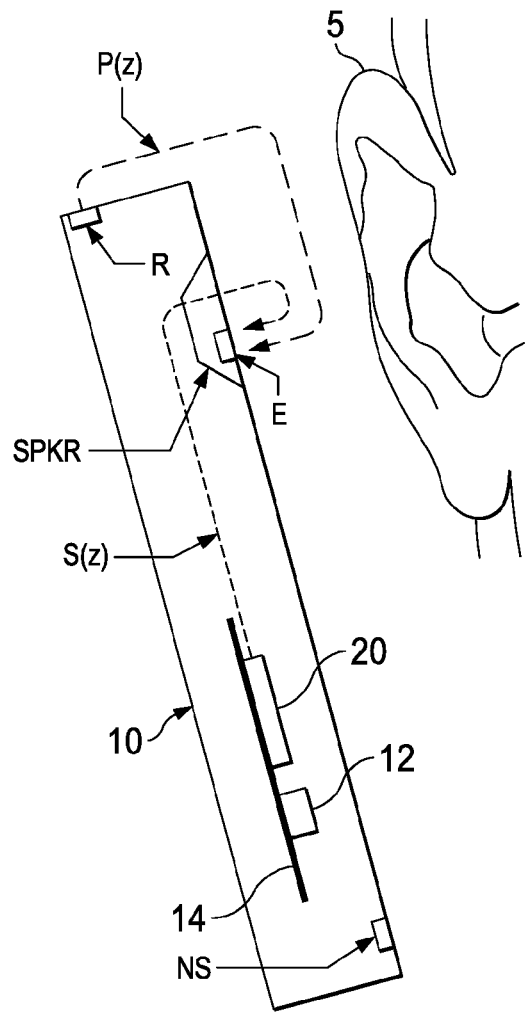
FIG. 1A is an illustration of an example personal audio device, in accordance with embodiments of the present disclosure.

Referring now to FIG. 1A, a personal audio device 10 as illustrated in accordance with embodiments of the present disclosure is shown in proximity to a human ear 5. Personal audio device 10 is an example of a device in which techniques in accordance with embodiments of the invention may be employed, but it is understood that not all of the elements or configurations embodied in illustrated personal audio device 10, or in the circuits depicted in subsequent illustrations, are required in order to practice the invention recited in the claims. Personal audio device 10 may include a transducer such as speaker SPKR that reproduces distant speech received by personal audio device 10, along with other local audio events such as ringtones, stored audio program material, injection of near-end speech (i.e., the speech of the user of personal audio device 10) to provide a balanced conversational perception, and other audio that requires reproduction by personal audio device 10, such as sources from webpages or other network communications received by personal audio device 10 and audio indications such as a low battery indication and other system event notifications. A near-speech microphone NS may be provided to capture near-end speech, which is transmitted from personal audio device 10 to the other conversation participant(s).

Personal audio device 10 may include adaptive noise cancellation (ANC) circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when personal audio device 10 is in close proximity to ear 5. Circuit 14 within personal audio device 10 may include an audio CODEC integrated circuit (IC) 20 that receives the signals from reference microphone R, near-speech microphone NS, and error microphone E, and interfaces with other integrated circuits such as a radio-frequency (RF) integrated circuit 12 having a wireless telephone transceiver. In some embodiments of the disclosure, the circuits and techniques disclosed herein may be incorporated in a single integrated circuit that includes control circuits and other functionality for implementing the entirety of the personal audio device, such as an MP3 player-on-a-chip integrated circuit. In these and other embodiments, the circuits and techniques disclosed herein may be implemented partially or fully in software and/or firmware embodied in computer-readable media and executable by a controller or other processing device.

In general, ANC techniques of the present disclosure measure ambient acoustic events (as opposed to the output of speaker SPKR and/or the near-end speech) impinging on reference microphone R, and by also measuring the same ambient acoustic events impinging on error microphone E, ANC processing circuits of personal audio device 10 adapt an anti-noise signal generated out of the output of speaker SPKR from the output of reference microphone R to have a characteristic that minimizes the amplitude of the ambient acoustic events at error microphone E. Because acoustic path P(z) extends from reference microphone R to error microphone E, ANC circuits are effectively estimating acoustic path P(z) while removing effects of an electro-acoustical path S(z) that represents the response of the audio output circuits of CODEC IC 20 and the acoustic/electric transfer function of speaker SPKR including the coupling between speaker SPKR and error microphone E in the particular acoustic environment, which may be affected by the proximity and structure of ear 5 and other physical objects and human head structures that may be in proximity to personal audio device 10, when personal audio device 10 is not firmly pressed to ear 5. While the illustrated personal audio device 10 includes a two-microphone ANC system with a third near-speech microphone NS, some aspects of the present invention may be practiced in a system that does not include separate error and reference microphones, or a wireless telephone that uses near-speech microphone NS to perform the function of the reference microphone R. Also, in personal audio devices designed only for audio playback, near-speech microphone NS will generally not be included, and the near-speech signal paths in the circuits described in further detail below may be omitted, without changing the scope of the disclosure, other than to limit the options provided for input to the microphone covering detection schemes. In addition, although only one reference microphone R is depicted in FIG. 1, the circuits and techniques herein disclosed may be adapted, without changing the scope of the disclosure, to personal audio devices including a plurality of reference microphones.

Figure 1B:
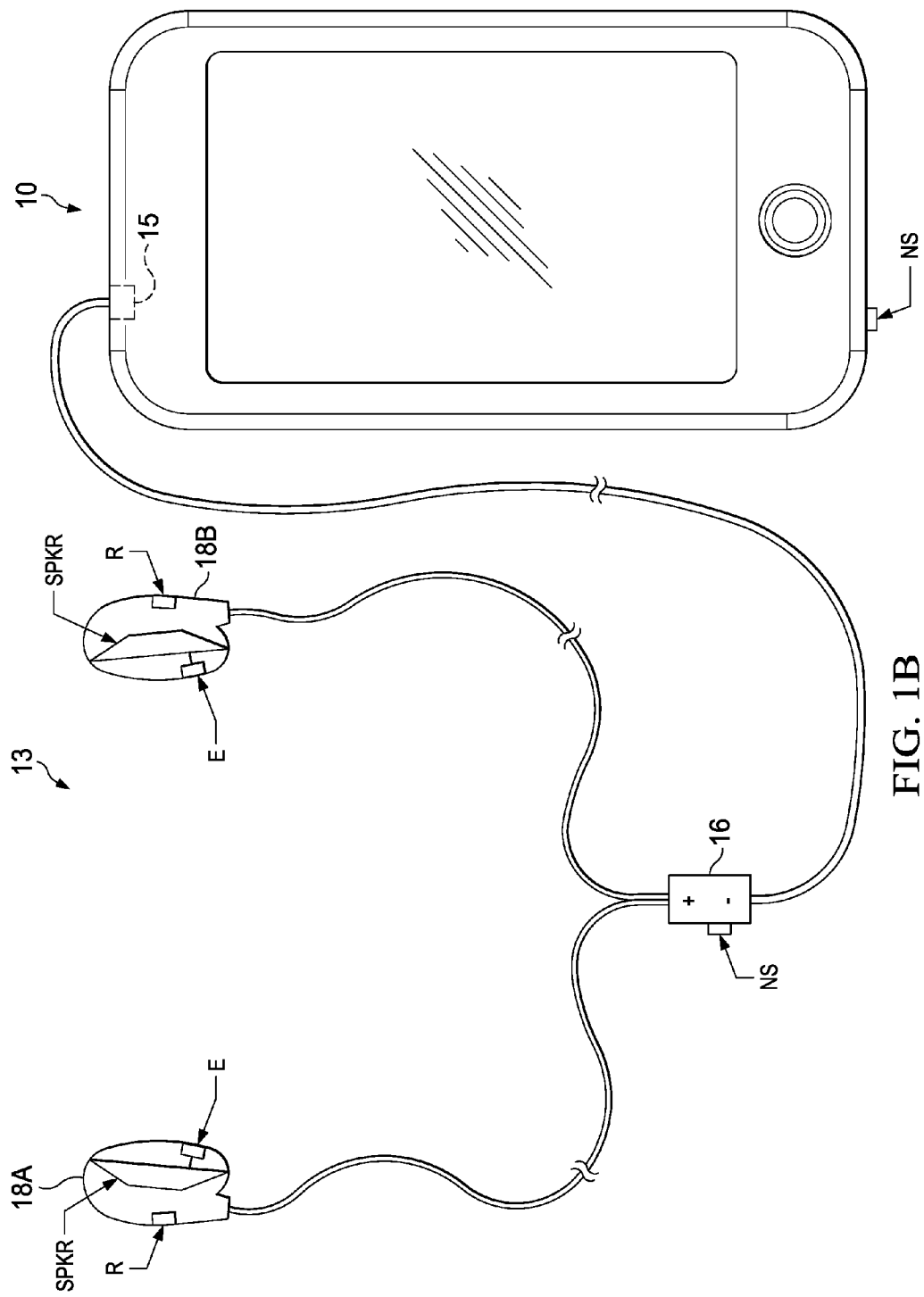
FIG. 1B is an illustration of an example personal audio device with a headphone assembly coupled thereto, in accordance with embodiments of the present disclosure.

Referring now to FIG. 1B, personal audio device 10 is depicted having a headphone assembly 13 coupled to it via audio port 15. Audio port 15 may be communicatively coupled to RF integrated circuit 12 and/or CODEC IC 20, thus permitting communication between components of headphone assembly 13 and one or more of RF integrated circuit 12 and/or CODEC IC 20. As shown in FIG. 1B, headphone assembly 13 may include a combox 16, a left headphone 18A, and a right headphone 18B. As used in this disclosure, the term "headphone" broadly includes any loudspeaker and structure associated therewith that is intended to be mechanically held in place proximate to a listener's ear or ear canal, and includes without limitation earphones, earbuds, and other similar devices. As more specific non-limiting examples, "headphone," may refer to intra-canal earphones, intra-concha earphones, supra-concha earphones, and supra-aural earphones.

Combox 16 or another portion of headphone assembly 13 may have a near-speech microphone NS to capture near-end speech in addition to or in lieu of near-speech microphone NS of personal audio device 10. In addition, each headphone 18A, 18B may include a transducer such as speaker SPKR that reproduces distant speech received by personal audio device 10, along with other local audio events such as ringtones, stored audio program material, injection of near-end speech (i.e., the speech of the user of personal audio device 10) to provide a balanced conversational perception, and other audio that requires reproduction by personal audio device 10, such as sources from webpages or other network communications received by personal audio device 10 and audio indications such as a low battery indication and other system event notifications. Each headphone 18A, 18B may include a reference microphone R for measuring the ambient acoustic environment and an error microphone E for measuring of the ambient audio combined with the audio reproduced by speaker SPKR close to a listener's ear when such headphone 18A, 18B is engaged with the listener's ear. In some embodiments, CODEC IC 20 may receive the signals from reference microphone R, near-speech microphone NS, and error microphone E of each headphone and perform adaptive noise cancellation for each headphone as described herein. In other embodiments, a CODEC IC 20 or another circuit may be present within headphone assembly 13, communicatively coupled to reference microphone R, near-speech microphone NS, and error microphone E, and configured to perform adaptive noise cancellation as described herein.

The various microphones referenced in this disclosure, including reference microphones, error microphones, and near-speech microphones, may comprise any system, device, or apparatus configured to convert sound incident at such microphone to an electrical signal that may be processed by a controller, and may include without limitation an electrostatic microphone, a condenser microphone, an electret microphone, an analog microelectromechanical systems (MEMS) microphone, a digital MEMS microphone, a piezoelectric microphone, a piezo-ceramic microphone, or dynamic microphone.

Figure 2:
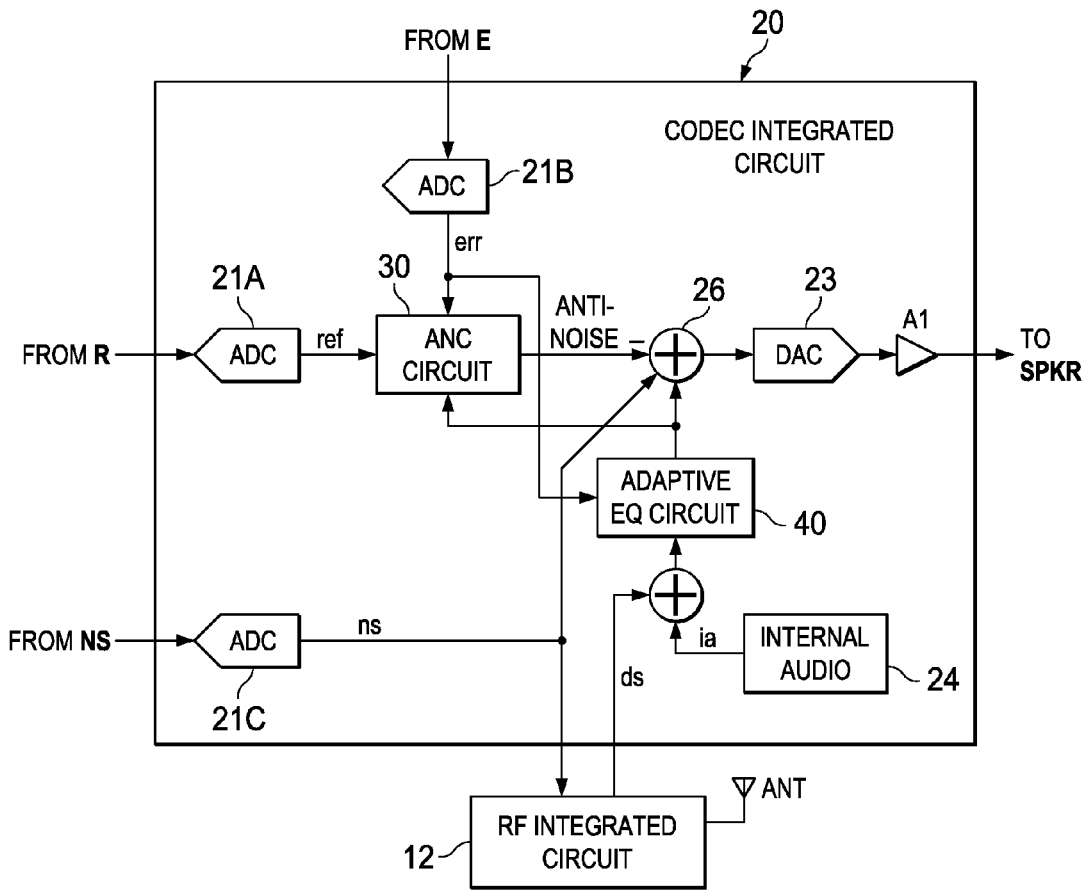
FIG. 2 is a block diagram of selected circuits within the personal audio device depicted in FIG. 1, in accordance with embodiments of the present disclosure.

Referring now to FIG. 2, selected circuits within personal audio device 10, which in other embodiments may be placed in whole or part in other locations, such as one or more headphone assemblies 13, are shown in a block diagram. CODEC IC 20 may include an analog-to-digital converter (ADC) 21A for receiving the reference microphone signal and generating a digital representation ref of the reference microphone signal, an ADC 21B for receiving the error microphone signal and generating a digital representation err of the error microphone signal, and an ADC 21C for receiving the near speech microphone signal and generating a digital representation ns of the near speech microphone signal. CODEC IC 20 may generate an output for driving speaker SPKR from an amplifier A1, which may amplify the output of a digital-to-analog converter (DAC) 23 that receives the output of a combiner 26. Combiner 26 may combine an equalized source audio signal generated by adaptive equalization circuit 40 from audio signals is from internal audio sources 24 and/or downlink speech ds which may be received from radio frequency (RF) integrated circuit 12, the anti-noise signal generated by ANC circuit 30, which by convention has the same polarity as the noise in reference microphone signal ref and is therefore subtracted by combiner 26, and a portion of near speech microphone signal ns so that the user of personal audio device 10 may hear his or her own voice in proper relation to downlink speech ds. Near speech microphone signal ns may also be provided to RF integrated circuit 12 and may be transmitted as uplink speech to the service provider via antenna ANT.

Figure 3:
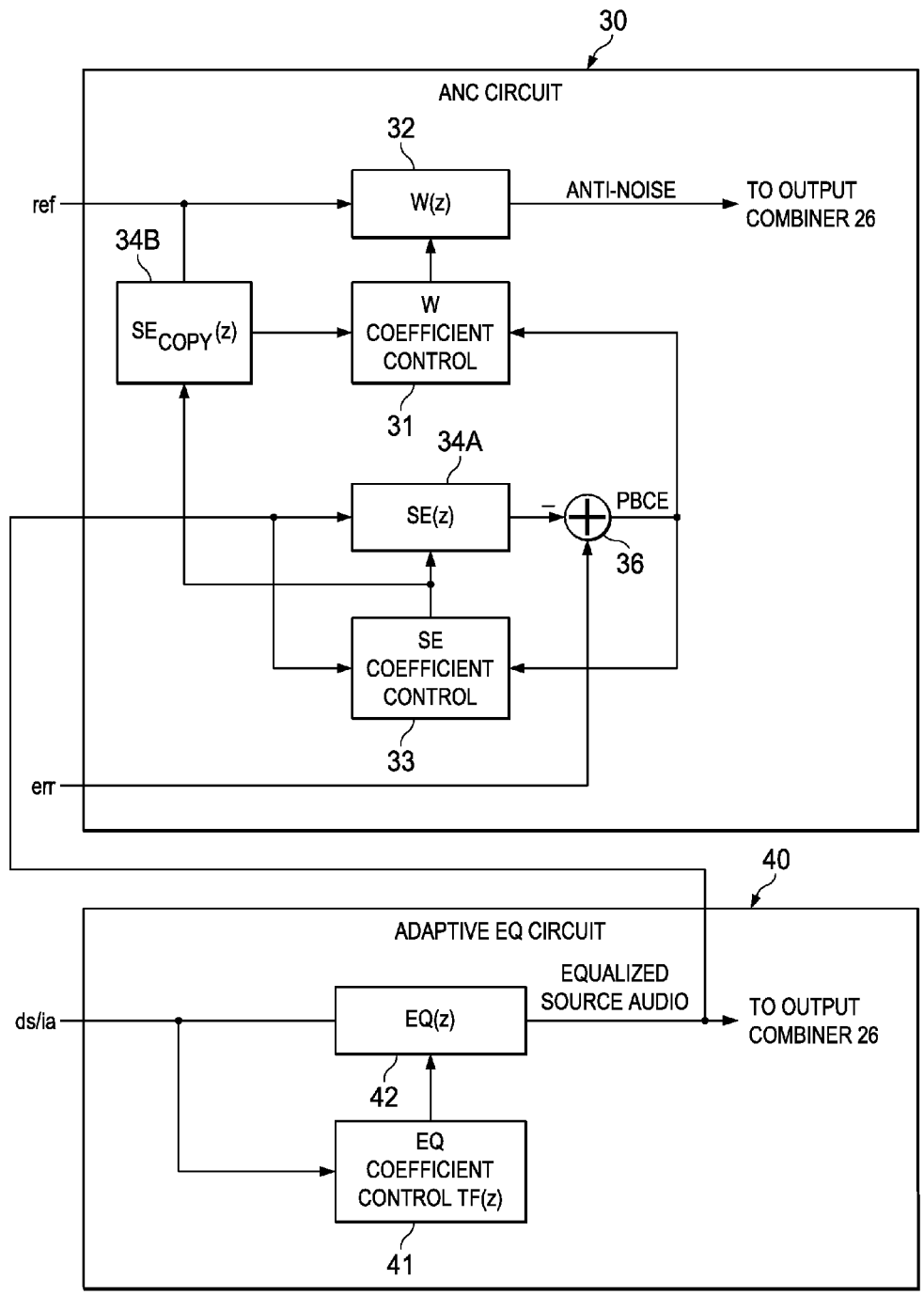
FIG. 3 is a block diagram depicting selected signal processing circuits and functional blocks within an example active noise canceling (ANC) circuit and an adaptive equalization circuit of a coder-decoder (CODEC) integrated circuit of FIG. 3, in accordance with embodiments of the present disclosure.

Referring now to FIG. 3, details of ANC circuit 30 and adaptive equalization circuit 40 are shown in accordance with embodiments of the present disclosure. With respect to ANC circuit 30, adaptive filter 32 may receive reference microphone signal ref and under ideal circumstances, may adapt its transfer function W(z) to approximate P(z)/S(z) to generate the anti-noise signal, which may be provided to an output combiner that combines the anti-noise signal with the audio to be reproduced by the transducer, as exemplified by combiner 26 of FIG. 2. The coefficients of adaptive filter 32 may be controlled by a W coefficient control block 31 that uses a correlation of signals to determine the response of adaptive filter 32, which generally minimizes the error, in a least-mean squares sense, between those components of reference microphone signal ref present in error microphone signal err. The signals compared by W coefficient control block 31 may be the reference microphone signal ref as shaped by a copy of a response SE(z) estimating the response of path S(z) provided by filter 34B and a playback corrected error, labeled as "PBCE" in FIG. 3, based at least in part on error microphone signal err. The response SE(z) and playback corrected error may be generated as described in greater detail below.

By transforming reference microphone signal ref with a copy of the estimate of the response of path S(z), response $SE_{COPY}(z)$ of filter 34B, and minimizing the difference between the resultant signal and error microphone signal err, adaptive filter 32 may adapt to the desired response of P(z)/S(z). In addition to error microphone signal err, the signal compared to the output of filter 34B by W coefficient control block 31 may include an inverted amount of equalized source audio signal (e.g., downlink audio signal ds and/or internal audio signal ia), that has been processed by filter response SE(z), of which response $SE_{COPY}(z)$ is a copy. By injecting an inverted amount of equalized source audio signal, adaptive filter 32 may be prevented from adapting to the relatively large amount of equalized source audio signal present in error microphone signal err. However, by transforming that inverted copy of equalized source audio signal with the estimate of the response of path S(z), the equalized source audio that is removed from error microphone signal err should match the expected version of the equalized source audio signal reproduced at error microphone signal err, because the electrical and acoustical path of S(z) is the path taken by the equalized source audio signal to arrive at error microphone E. Filter 34B may not be an adaptive filter, per se, but may have an adjustable response that is tuned to match the response of adaptive filter 34A, so that the response of filter 34B tracks the adapting of adaptive filter 34A.

To implement the above, adaptive filter 34A may have coefficients controlled by SE coefficient control block 33, which may compare the equalized source audio signal and a playback corrected error. The playback corrected error may be equal to error microphone signal err after removal of the equalized source audio signal (as filtered by filter 34A to represent the expected playback audio delivered to error microphone E) by a combiner 36. SE coefficient control block 33 may correlate the actual equalized source audio signal with the components of the equalized source audio signal that are present in error microphone signal err. Adaptive filter 34A may thereby be adapted to generate a secondary estimate signal from the equalized source audio signal, that when subtracted from error microphone signal err to generate the playback corrected error, includes the content of error microphone signal err that is not due to the equalized source audio signal.

Although FIGS. 2 and 3 depict a feedforward ANC system in which an anti-noise signal is generated from a filtered reference microphone signal, any other suitable ANC system employing an error microphone may be used in connection with the methods and systems disclosed herein. For example, in some embodiments, an ANC circuit employing feedback ANC, in which anti-noise is generated from a playback corrected error signal, may be used instead of or in addition to feedforward ANC, as depicted in FIGS. 2 and 3.

With respect to adaptive equalizer circuit 40, adjustable equalization filter 42 may receive the source audio signal (e.g., downlink speech ds and/or internal audio ia) and may adapt its transfer function EQ(z) in conformity with a target filter of response TF(z) to generate the equalized source audio signal, which may be provided to ANC circuit 30 (as described above) and provided to an output combiner that combines the anti-noise signal with the equalized source audio signal to be reproduced by the transducer, as exemplified by combiner 26 of FIG. 2. The coefficients of adjustable equalization filter 42 may be controlled by an equalizer coefficient control block 41 configured to shape the response EQ(z) of adjustable equalization filter 42 in conformity with a response TF(z) of a target filter by adapting the response EQ(z) of the adjustable equalization filter to minimize a difference between the response TF(z) of the target filter and the response EQ(z) of the adjustable equalization filter. The response TF(z) of the target filter may be a function of the response SE(z) of adaptive filter 34A.

For example, in some embodiments, the response TF(z) of the target filter may be equal to the ratio of an ideal response SF(z) of the electro-acoustical path to the response SE(z) of secondary path estimate filter 34A. The response SF(z), which may be based on laboratory or production measurements or characterizations, may be a representation of an ideal or desired transfer function to be accomplished by the actual response S(z) of the electro-acoustical path. Thus, the response SF(z) seeks to preserve desirable acoustic properties which are audible to a listener. However, because response S(z) may change over time or change based on environmental or other factors (e.g., placement of a transducer in relation to a listener's ear), response S(z) may differ from the desired response SF(z). As the actual response S(z) changes, so too does response SE(z) of secondary path estimate filter 34A. Accordingly, transfer function EQ(z) of adjustable equalization filter 42, by adapting towards a response TF(z) of a target filter which is a function of response SE(z) of secondary path estimate filter 34A, may serve as a correction filter which may undo the effects of a changing response S(z) so that the path of the source audio signal more closely approximates the desired response SF(z). To illustrate, a transfer function Y(z) of a source audio signal PB(z) through speaker SPKR may be given as:

$$Y(z)=PB(z) \cdot S(z) \approx PB(z) \cdot SE(z)$$

However, the ideal transfer function of the source audio signal PB(z) through speaker SPKR may be given as:

$$Y_{ideal}(z)=PB(z) \cdot SF(z)$$

The difference between the desired transfer function $Y_{ideal}(z)$ and the actual transfer function Y(z) may be expressed as a ratio of the two in the z-domain. This difference becomes the response TF(z) of the target filter implemented by coefficient control block 41:

$$TF(z)=SF(z)/SE(z) \approx SF(z)/S(z)=Y_{ideal}(z)/Y(z)$$

If this difference, the response TF(z), is applied to the source audio signal, then the desired response SF(z) to be applied to the source audio signal is approximated:

$$Y_{actual}(Z)=PB(z) \cdot TF(z) \cdot S(z)=PB(z) \cdot (SF(z)/SE(z)) \cdot S(z) \approx PB(z) \cdot SF(z)$$

In some embodiments, adjustable equalization filter 42 may be applied to the source audio signal at the same sampling rate as the source audio signal (e.g., the baseband rate). However, response TF(z) may be computed at a slower rate, such that when response TF(z) is updated, it may differ significantly from the response EQ(z). Accordingly, it may be desirable to adapt response EQ(z) towards response TF(z) in a manner which smoothly converges response EQ(z) towards response TF(z) in order to avoid creating audio artifacts which may be audible to a listener. Such smooth convergence may be accomplished in any suitable manner.

For example, in some embodiments, a "cross-fade" mechanism may be used to accomplish such smooth convergence. In such embodiments, the source audio signal may be filtered by each of adjustable equalization filter 42 and the target filter implemented by coefficient control block 41 to generate outputs $X_{EQ}(z)=EQ(z) \cdot PB(z)$ and $X_{TF}(z)=TF(z) \cdot PB(z)$, respectively. The outputs may then be individually weighted and summed to provide the equalized source audio signal $X(z)=\lambda \cdot X_{TF}(z)+(1-\lambda) \cdot X_{EQ}(z)$. To cross-fade, the value of $\lambda$ may be dynamically and gradually ramped from 0 to 1, so that equalized source audio signal X(z) is initially the value of $X_{EQ}(z)$ at $\lambda=0$, and transitions towards $X_{EQ}(z)$ at $\lambda=1$. Response EQ(z) of adjustable equalization filter 42 may then be made equal to response TF(z), the target filter, and its response TF(z) may again be updated based on response SE(z), and the cross-fade applied again.

Figure 4:
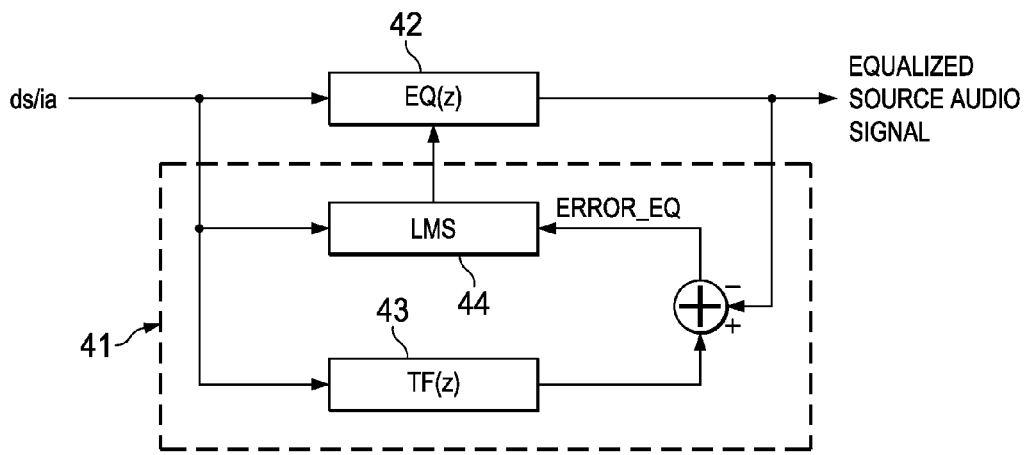
FIG. 4 is a block diagram depicting least-mean-squares adaptation of an adjustable equalization filter, in accordance with embodiments of the present disclosure.

As another example, in these and other embodiments, least-mean-squares (LMS) techniques may be applied to drive adaptation of response EQ(z) towards response TF(z), as shown in FIG. 4. As shown in FIG. 4, coefficients of adjustable equalization filter 42 may be controlled by an LMS control block 44 that may shape the response EQ(z) of adjustable equalization filter 42 in conformity with the source audio signal and an equalization error ERROR_EQ equal to the difference between the source audio signal as filtered by response TF(z) of filter 43 and the equalized source audio signal, by adapting coefficients of adjustable equalization filter 42 to minimize equalization error ERROR_EQ.

Figure 5:
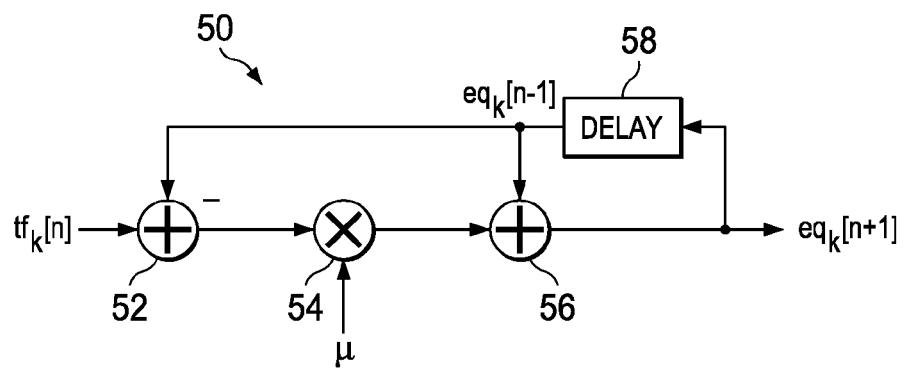
FIG. 5 illustrates a block diagram depicting a method for exponential smoothing of a single coefficient for an adjustable equalization filter, in accordance with embodiments of the present disclosure.

LMS control block 44 may apply at least one of exponential smoothing and linear interpolation to perform such adaptation. In some embodiments, the LMS control block 44 may update all coefficients of adjustable equalization filter 42 for each sample of the source audio signal. In other embodiments, processing requirements of adaptive equalization circuit 40 may be minimized by LMS control block 44 updating only one coefficient of adjustable equalization filter 42 for each sample of the source audio signal. FIG. 5 illustrates a block diagram 50 depicting a method for exponential smoothing of a single coefficient for adjustable equalization filter 42, in accordance with embodiments of the present disclosure. As shown in FIG. 5, in the discrete-time domain where a discrete time is given by n, a coefficient $eq_k[n]$ for adjustable equalization filter 42 may be subtracted from a coefficient $tf_k[n]$ for filter 43 by a combiner 52. The result may be multiplied by a constant $\mu$ at multiplier 54. The constant $\mu$ may be a user-adjustable constant which may control or define a rate of adaptation of a coefficient. The result from multiplier 54 may be added to coefficient $eq_k[n]$ at combiner 56, resulting in the coefficient $eq_k[n+1]$ of the next time step. The coefficient $eq_k[n+1]$ may be delayed by delay block 58 by a discrete time step before being fed back to combiners 52 and 56. Accordingly, the value of a coefficient of adjustable equalization filter 42 in embodiments in which each coefficient is updated at each discrete time interval n may be given by the equation:

$$eq_k[n+1]=\mu(tf_k[n]-eq_k[n])+eq_k[n]$$

where k may have a value between 0 and M−1, where M is the number of coefficients of adjustable equalization filter 42. On the other hand, in embodiments in which a single coefficient is updated for each discrete time interval n may be given by:

$$eq_{n \% M}[n+1]=\mu(tf_{n \% M}[n]-eq_{n \% M}[n])+eq_{n \% M}[n]$$

where M is the number of coefficients of adjustable equalization filter 42 and % is the modulo operator.

In addition to the equalization functionality described above, adaptive equalization circuit 40 may perform other functions. For example, in some embodiments, adaptive equalization circuit 40 may perform frequency emphasis allowing for gain or attenuation of certain frequencies. In some of these embodiments, gain emphasis may be fixed by incorporating frequency emphasis into the ideal response SF(z). In other of these embodiments, adaptive equalization circuit 40 may implement frequency emphasis via fixed filters after the application of response EQ(z) to the source audio signal. Frequency emphasis may additionally or alternatively be incorporated into response TF(z), wherein frequency-emphasis shaped signals change the ratio SF(z)/SE(z).

As another example, in these and other embodiments, adaptive equalization circuit 40 may perform psychoacoustic signal processing (e.g., virtual bass) in conjunction with equalization. Such psychoacoustic signal processing may be performed prior to or after application of adjustable equalization filter 42, or may be incorporated into the equalization performed by adjustable equalization filter 42.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A personal audio device, comprising:
   a personal audio device housing;
   a transducer coupled to the housing for reproducing an output audio signal including an equalized source audio signal for playback to a listener;
   an error microphone coupled to the housing in proximity to the transducer for providing an error microphone signal indicative of an acoustic output of the transducer;
   a processing circuit that implements:
      a secondary path estimate filter for modeling an electro-acoustical path of a source audio signal through the transducer;
      a secondary path estimate filter coefficient control block that shapes a response of the secondary path estimate filter in conformity with the error microphone signal;
      an adjustable equalization filter having a response that generates an equalized source audio signal from the source audio signal to account for effects of changes in the electro-acoustical path of the source audio signal;
      an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter; and
      a mixer for outputting a blended equalized source audio signal, wherein the blended equalized source audio signal is cross-faded between the source audio signal as filtered by the target filter and the source audio signal as filtered by the adjustable equalization filter.

2. The personal audio device of claim 1, wherein the equalizer coefficient control block is configured to shape the response of the adjustable equalization filter in conformity with the response of the target filter by adapting the response of the adjustable equalization filter to minimize a difference between the source audio signal as filtered by the target filter and the source audio signal as filtered by the adjustable equalization filter using a least-mean-squares adaptation technique.

3. The personal audio device of claim 2, wherein the least-mean-squares adaptation technique comprises updating one coefficient of the adjustable equalization filter for each sample of the source audio signal by applying at least one of exponential smoothing and linear interpolation.

4. The personal audio device of claim 2, wherein the least-mean-squares adaptation technique comprises updating all coefficients of the adjustable equalization filter for each sample of the source audio signal by applying at least one of exponential smoothing and linear interpolation.

5. The personal audio device of claim 1, wherein:
   the error microphone signal is indicative of the acoustic output of the transducer and ambient audio sounds at the transducer; and
   the processing circuit is further configured to implement a noise cancellation system that generates an anti-noise signal to reduce the presence of the ambient audio sounds heard by the listener based at least on the error microphone signal.

6. The personal audio device of claim 1, wherein the response of the adjustable equalization filter further applies frequency emphasis to the source audio signal.

7. The personal audio device of claim 1, wherein the response of the adjustable equalization filter further applies psychoacoustic enhancement to the source audio signal.

8. The personal audio device of claim 1, wherein the response of the secondary path estimate filter generates a secondary path estimate from the equalized source audio signal.

9. The personal audio device of claim 1, wherein the secondary path estimate filter coefficient control block shapes a response of the secondary path estimate filter in conformity with the equalized source audio signal and a playback corrected error by adapting the response of the secondary path estimate filter to minimize the playback corrected error, wherein the playback corrected error is based on a difference between the error microphone signal and a secondary path estimate generated by filtering the equalized source audio signal with the secondary path estimate filter.

10. A method comprising:
receiving an error microphone signal indicative of an acoustic output of a transducer;
modeling an electro-acoustical path of a source audio signal with a secondary path estimate filter;
adapting a response of the secondary path estimate filter in conformity with the error microphone signal;
generating an equalized source audio signal from a source audio signal by filtering the source audio signal with an adjustable equalization filter to account for effects of changes in the electro-acoustical path of the source audio signal;
adapting a response of the adjustable equalization filter in response to changes in the response of the secondary path estimate filter to minimize a difference between the response of a target filter and the response of the adjustable equalization filter wherein the target filter has a response which is a function of the response of the secondary path estimate filter; and
outputting a blended equalized source audio signal, wherein the blended equalized source audio signal is cross-faded between the source audio signal as filtered by the target filter and the source audio signal as filtered by the adjustable equalization filter.

11. The method of claim 10, further comprising adapting the response of the adjustable equalization filter to minimize a difference between the source audio signal as filtered by the target filter and the source audio signal as filtered by adjustable equalization filter using a least-mean-squares adaptation technique.

12. The method of claim 11, wherein the least-mean-squares adaptation technique comprises updating one coefficient of the adjustable equalization filter for each sample of the source audio signal by applying at least one of exponential smoothing and linear interpolation.

13. The method of claim 11, wherein the least-mean-squares adaptation technique comprises updating all coefficients of the adjustable equalization filter for each sample of the source audio signal by applying at least one of exponential smoothing and linear interpolation.

14. The method of claim 10, wherein the error microphone signal is indicative of the acoustic output of the transducer and ambient audio sounds at the transducer, and the method further comprises generating an anti-noise signal to reduce the presence of the ambient audio sounds heard by a listener of the transducer based at least on the error microphone signal.

15. The method of claim 10, further comprising applying frequency emphasis to the source audio signal.

16. The method of claim 10, further comprises applying psychoacoustic enhancement to the source audio signal.

17. The method of claim 10, further comprising generating a secondary path estimate from the equalized source audio signal with the secondary path estimate filter.

18. The method of claim 10, wherein adapting the response of the adjustable equalization filter comprises shaping a response of the secondary path estimate filter in conformity with the equalized source audio signal and a playback corrected error by adapting the response of the secondary path estimate filter to minimize the playback corrected error, wherein the playback corrected error is based on a difference between the error microphone signal and the secondary path estimate.

19. An integrated circuit comprising:
an output for providing a signal to a transducer including an equalized source audio signal for playback;
an error microphone input for receiving an error microphone signal indicative of an acoustic output of the transducer; and
a processing circuit that implements:
a secondary path estimate filter for modeling an electro-acoustical path of a source audio signal through the transducer;
a secondary path estimate filter coefficient control block that shapes a response of the secondary path estimate filter in conformity with the error microphone signal;
an adjustable equalization filter having a response that generates the equalized source audio signal from the source audio signal to account for effects of changes in the electro-acoustical path of the source audio signal;
an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter; and
a mixer for outputting a blended equalized source audio signal, wherein the blended equalized source audio signal is cross-faded between the source audio signal as filtered by the target filter and the source audio signal as filtered by the adjustable equalization filter.

20. The integrated circuit of claim 19, wherein the equalizer coefficient control block is configured to shape the response of the adjustable equalization filter in conformity with the response of the target filter by adapting the response of the adjustable equalization filter to minimize a difference between the source audio signal as filtered by the target filter and the source audio signal as filtered by the adjustable equalization filter using a least-mean-squares adaptation technique.

21. The integrated circuit of claim 20, wherein the least-mean-squares adaptation technique comprises updating one coefficient of the adjustable equalization filter for each sample of the source audio signal by applying at least one of exponential smoothing and linear interpolation.

22. The integrated circuit of claim 20, wherein the least-mean-squares adaptation technique comprises updating all coefficients of the adjustable equalization filter for each sample of the source audio signal by applying at least one of exponential smoothing and linear interpolation.

23. The integrated circuit of claim 19, wherein:
the error microphone signal is indicative of the acoustic output of the transducer and ambient audio sounds at the transducer; and
the processing circuit is further configured to implement a noise cancellation system that generates an anti-noise signal to reduce the presence of the ambient audio sounds heard by a listener of the transducer based at least on the error microphone signal.

24. The integrated circuit of claim 19, wherein the response of the adjustable equalization filter further applies frequency emphasis to the source audio signal.

25. The integrated circuit of claim 19, wherein the response of the adjustable equalization filter further applies psychoacoustic enhancement to the source audio signal.

26. The integrated circuit of claim 19, wherein the response of the secondary path estimate filter generates a secondary path estimate from the equalized source audio signal.

27. The integrated circuit of claim 19, wherein the secondary path estimate filter coefficient control block shapes a response of the secondary path estimate filter in conformity with the equalized source audio signal and a playback corrected error by adapting the response of the secondary path estimate filter to minimize the playback corrected error, wherein the playback corrected error is based on a difference between the error microphone signal and a secondary path estimate generated by filtering the equalized source audio signal with the secondary path estimate filter.

28. A personal audio device comprising:
a personal audio device housing;
a transducer coupled to the housing for reproducing an output audio signal including an equalized source audio signal for playback to a listener;
an error microphone coupled to the housing in proximity to the transducer for providing an error microphone signal indicative of an acoustic output of the transducer;
a processing circuit that implements:
a secondary path estimate filter for modeling an electro-acoustical path of a source audio signal through the transducer;
a secondary path estimate filter coefficient control block that shapes a response of the secondary path estimate filter in conformity with the error microphone signal;
an adjustable equalization filter having a response that generates an equalized source audio signal from the source audio signal to account for effects of changes in the electro-acoustical path of the source audio signal; and
an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter;
wherein the equalizer coefficient control block is configured to shape the response of the adjustable equalization filter in conformity with the response of the target filter by adapting the response of the adjustable equalization filter to minimize a difference between the source audio signal as filtered by the target filter and the source audio signal as filtered by the adjustable equalization filter using a least-mean-squares adaptation technique.

29. The personal audio device of claim 28, wherein the least-mean-squares adaptation technique comprises updating one coefficient of the adjustable equalization filter for each sample of the source audio signal by applying at least one of exponential smoothing and linear interpolation.

30. The personal audio device of claim 28, wherein the least-mean-squares adaptation technique comprises updating all coefficients of the adjustable equalization filter for each sample of the source audio signal by applying at least one of exponential smoothing and linear interpolation.

31. The personal audio device of claim 28, wherein:
the error microphone signal is indicative of the acoustic output of the transducer and ambient audio sounds at the transducer; and
the processing circuit is further configured to implement a noise cancellation system that generates an anti-noise signal to reduce the presence of the ambient audio sounds heard by the listener based at least on the error microphone signal.

32. The personal audio device of claim 28, wherein the response of the adjustable equalization filter further applies frequency emphasis to the source audio signal.

33. The personal audio device of claim 28, wherein the response of the adjustable equalization filter further applies psychoacoustic enhancement to the source audio signal.

34. The personal audio device of claim 28, wherein the response of the secondary path estimate filter generates a secondary path estimate from the equalized source audio signal.

35. The personal audio device of claim 28, wherein the secondary path estimate filter coefficient control block shapes a response of the secondary path estimate filter in conformity with the equalized source audio signal and a playback corrected error by adapting the response of the secondary path estimate filter to minimize the playback corrected error, wherein the playback corrected error is based on a difference between the error microphone signal and a secondary path estimate generated by filtering the equalized source audio signal with the secondary path estimate filter.

36. A method comprising:
receiving an error microphone signal indicative of an acoustic output of a transducer;
modeling an electro-acoustical path of a source audio signal with a secondary path estimate filter;
adapting a response of the secondary path estimate filter in conformity with the error microphone signal;
generating an equalized source audio signal from a source audio signal by filtering the source audio signal with an adjustable equalization filter to account for effects of changes in the electro-acoustical path of the source audio signal;
adapting a response of the adjustable equalization filter in response to changes in the response of the secondary path estimate filter to minimize a difference between the response of the target filter and the response of the adjustable equalization filter; and
adapting the response of the adjustable equalization filter to minimize a difference between the source audio signal as filtered by the target filter and the source audio signal as filtered by adjustable equalization filter using a least-mean-squares adaptation technique.

37. The method of claim 36, wherein the least-mean-squares adaptation technique comprises updating one coefficient of the adjustable equalization filter for each sample of the source audio signal by applying at least one of exponential smoothing and linear interpolation.

38. The method of claim 36, wherein the least-mean-squares adaptation technique comprises updating all coefficients of the adjustable equalization filter for each sample of the source audio signal by applying at least one of exponential smoothing and linear interpolation.

39. The method of claim 36, wherein the error microphone signal is indicative of the acoustic output of the transducer and ambient audio sounds at the transducer, and the method further comprises generating an anti-noise signal to reduce the presence of the ambient audio sounds heard by a listener of the transducer based at least on the error microphone signal.

40. The method of claim 36, further comprising applying frequency emphasis to the source audio signal.

41. The method of claim 36, further comprises applying psychoacoustic enhancement to the source audio signal.

42. The method of claim 36, further comprising generating a secondary path estimate from the equalized source audio signal with the secondary path estimate filter.

43. The method of claim 36, wherein adapting the response of the adjustable equalization filter comprises shaping a response of the secondary path estimate filter in conformity with the equalized source audio signal and a playback corrected error by adapting the response of the secondary path estimate filter to minimize the playback corrected error, wherein the playback corrected error is based on a difference between the error microphone signal and the secondary path estimate.

44. An integrated circuit comprising:
an output for providing a signal to a transducer including an equalized source audio signal for playback;
an error microphone input for receiving an error microphone signal indicative of an acoustic output of the transducer; and
a processing circuit that implements:
  a secondary path estimate filter for modeling an electro-acoustical path of a source audio signal through the transducer;
  a secondary path estimate filter coefficient control block that shapes a response of the secondary path estimate filter in conformity with the error microphone signal;
  an adjustable equalization filter having a response that generates the equalized source audio signal from the source audio signal to account for effects of changes in the electro-acoustical path of the source audio signal; and
  an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter, wherein the equalizer coefficient control block is configured to shape the response of the adjustable equalization filter in conformity with the response of the target filter by adapting the response of the adjustable equalization filter to minimize a difference between the source audio signal as filtered by the target filter and the source audio signal as filtered by the adjustable equalization filter using a least-mean-squares adaptation technique.

45. The integrated circuit of claim 44, wherein the least-mean-squares adaptation technique comprises updating one coefficient of the adjustable equalization filter for each sample of the source audio signal by applying at least one of exponential smoothing and linear interpolation.

46. The integrated circuit of claim 44, wherein the least-mean-squares adaptation technique comprises updating all coefficients of the adjustable equalization filter for each sample of the source audio signal by applying at least one of exponential smoothing and linear interpolation.

47. The integrated circuit of claim 44, wherein:
the error microphone signal is indicative of the acoustic output of the transducer and ambient audio sounds at the transducer; and
the processing circuit is further configured to implement a noise cancellation system that generates an anti-noise signal to reduce the presence of the ambient audio sounds heard by a listener of the transducer based at least on the error microphone signal.

48. The integrated circuit of claim 44, wherein the response of the adjustable equalization filter further applies frequency emphasis to the source audio signal.

49. The integrated circuit of claim 44, wherein the response of the adjustable equalization filter further applies psychoacoustic enhancement to the source audio signal.

50. The integrated circuit of claim 44, wherein the response of the secondary path estimate filter generates a secondary path estimate from the equalized source audio signal.

51. The integrated circuit of claim 44, wherein the secondary path estimate filter coefficient control block shapes a response of the secondary path estimate filter in conformity with the equalized source audio signal and a playback corrected error by adapting the response of the secondary path estimate filter to minimize the playback corrected error, wherein the playback corrected error is based on a difference between the error microphone signal and a secondary path estimate generated by filtering the equalized source audio signal with the secondary path estimate filter.

* * * * *

UNITED STATES PATENT AND TRADEMARK OFFICE
CERTIFICATE OF CORRECTION

| | | |
|---|---|---|
| PATENT NO. | : 9,807,503 B1 | Page 1 of 3 |
| APPLICATION NO. | : 15/272169 | |
| DATED | : October 31, 2017 | |
| INVENTOR(S) | : Bryant E. Sorensen, Jon D. Hendrix and John L. Melanson | |

It is certified that error appears in the above-identified patent and that said Letters Patent is hereby corrected as shown below:

In the Claims

Please amend Claim 1 as follows:
1. A personal audio device, comprising:
    a personal audio device housing;
    a transducer coupled to the housing for reproducing an output audio signal including an equalized source audio signal for playback to a listener;
    an error microphone coupled to the housing in proximity to the transducer for providing an error microphone signal indicative of an acoustic output of the transducer; and
    a processing circuit that implements:
        a secondary path estimate filter for modeling an electro-acoustical path of a source audio signal through the transducer;
        a secondary path estimate filter coefficient control block that shapes a response of the secondary path estimate filter in conformity with the error microphone signal;
        an adjustable equalization filter having a response that generates an equalized source audio signal from the source audio signal to account for effects of changes in the electro-acoustical path of the source audio signal;
        an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter;
and
        a mixer for outputting a blended equalized source audio signal, wherein the blended equalized source audio signal is cross-faded between the source audio signal as filtered by the target filter and the source audio signal as filtered by the adjustable equalization filter.

Signed and Sealed this
Twenty-sixth Day of December, 2017

Joseph Matal
*Performing the Functions and Duties of the
Under Secretary of Commerce for Intellectual Property and
Director of the United States Patent and Trademark Office*

Please amend the formatting of Claim 11 to appear as follows:
11. The method of Claim 10, further comprising adapting the response of the adjustable equalization filter to minimize a difference between the source audio signal as filtered by the target filter and the source audio signal as filtered by the adjustable equalization filter using a least-mean-squares adaptation technique.

Please amend the formatting of Claim 16 to appear as follows:
16. The method of Claim 10, further comprising applying psychoacoustic enhancement to the source audio signal.

Please amend the formatting of Claim 28 to appear as follows:
28. A personal audio device comprising:
    a personal audio device housing;
    a transducer coupled to the housing for reproducing an output audio signal including an equalized source audio signal for playback to a listener;
    an error microphone coupled to the housing in proximity to the transducer for providing an error microphone signal indicative of an acoustic output of the transducer; and
    a processing circuit that implements:
        a secondary path estimate filter for modeling an electro-acoustical path of a source audio signal through the transducer;
        a secondary path estimate filter coefficient control block that shapes a response of the secondary path estimate filter in conformity with the error microphone signal;
        an adjustable equalization filter having a response that generates an equalized source audio signal from the source audio signal to account for effects of changes in the electro-acoustical path of the source audio signal; and
        an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter;
    wherein the equalizer coefficient control block is configured to shape the response of the adjustable equalization filter in conformity with the response of the target filter by adapting the response of the adjustable equalization filter to minimize a difference between the source audio signal as filtered by the target filter and the source audio signal as filtered by the adjustable equalization filter using a least-mean-squares adaptation technique.

Please amend the formatting of Claim 36 to appear as follows:
36. A method comprising:
    receiving an error microphone signal indicative of an acoustic output of a transducer;
    modeling an electro-acoustical path of a source audio signal with a secondary path estimate filter;
    adapting a response of the secondary path estimate filter in conformity with the error microphone signal;

generating an equalized source audio signal from a source audio signal by filtering the source audio signal with an adjustable equalization filter to account for effects of changes in the electro-acoustical path of the source audio signal;
      adapting a response of the adjustable equalization filter in response to changes in the response of the secondary path estimate filter to minimize a difference between the response of the target filter and the response of the adjustable equalization filter; and
      adapting the response of the adjustable equalization filter to minimize a difference between the source audio signal as filtered by the target filter and the source audio signal as filtered by the adjustable equalization filter using a least-mean-squares adaptation technique.

Please amend the formatting of Claim 41 to appear as follows:
41. The method of Claim 36, further comprising applying psychoacoustic enhancement to the source audio signal.